United States Patent
Dobrinsky et al.

(10) Patent No.: US 10,461,221 B2
(45) Date of Patent: Oct. 29, 2019

(54) SEMICONDUCTOR DEVICE WITH IMPROVED LIGHT PROPAGATION

(71) Applicant: Sensor Electronic Technology, Inc., Columbia, SC (US)

(72) Inventors: Alexander Dobrinsky, Loudonville, NY (US); Michael Shur, Latham, NY (US)

(73) Assignee: Sensor Electronic Technology, Inc., Columbia, SC (US)

(*) Notice: Subject to any disclaimer, the term of this patent is extended or adjusted under 35 U.S.C. 154(b) by 0 days.

(21) Appl. No.: 15/409,438

(22) Filed: Jan. 18, 2017

(65) Prior Publication Data
US 2017/0207367 A1 Jul. 20, 2017

Related U.S. Application Data

(60) Provisional application No. 62/279,903, filed on Jan. 18, 2016.

(51) Int. Cl.
*H01L 33/22* (2010.01)
*H01L 33/00* (2010.01)
(Continued)

(52) U.S. Cl.
CPC ............ *H01L 33/22* (2013.01); *H01L 33/007* (2013.01); *H01L 33/0025* (2013.01);
(Continued)

(58) Field of Classification Search
CPC ....................................................... H01L 33/22
See application file for complete search history.

(56) References Cited

U.S. PATENT DOCUMENTS

| 4,497,974 A | 2/1985 | Deckman et al. |
| 5,779,924 A | 7/1998 | Krames et al. |

(Continued)

FOREIGN PATENT DOCUMENTS

| JP | 2003197963 A | 7/2003 |
| JP | 2009242130 A | 10/2009 |

(Continued)

OTHER PUBLICATIONS

Abouelsaood, A., "Modeling light scattering from mesoporous silicon," Journal of Applied Physics, Mar. 1, 2002, 8 pages, vol. 91, No. 5.

(Continued)

*Primary Examiner* — Eugene Lee
(74) *Attorney, Agent, or Firm* — LaBatt, LLC

(57) ABSTRACT

A semiconductor structure for use in fabricating a semiconductor device having improved light propagation is provided. The structure includes at least one layer transparent to radiation having a target wavelength relevant to operation of the semiconductor device. During operation of the semiconductor device, radiation of the target wavelength enters the transparent layer through a first side and exits the transparent layer through a second side. At least one of the first side or the second side comprises a profiled surface. The profiled surface includes a plurality of vacancies fabricated in the material of the layer. Each vacancy comprises side walls configured for at least partial diffusive scattering of the radiation of the target wavelength.

20 Claims, 12 Drawing Sheets

(51) Int. Cl.
| | | |
|---|---|---|
| H01L 33/06 | (2010.01) | |
| H01L 33/10 | (2010.01) | |
| H01L 33/12 | (2010.01) | |
| H01L 33/14 | (2010.01) | |
| H01L 33/32 | (2010.01) | |
| H01L 33/38 | (2010.01) | |

(52) U.S. Cl.
CPC .............. *H01L 33/06* (2013.01); *H01L 33/10* (2013.01); *H01L 33/12* (2013.01); *H01L 33/145* (2013.01); *H01L 33/325* (2013.01); *H01L 33/38* (2013.01); *H01L 2933/0091* (2013.01)

(56) References Cited

U.S. PATENT DOCUMENTS

| | | |
|---|---|---|
| 6,441,403 B1 | 8/2002 | Chang et al. |
| 6,649,939 B1 | 11/2003 | Wirth |
| 6,657,236 B1 | 12/2003 | Thibeault et al. |
| 6,791,119 B2 | 9/2004 | Slater, Jr. et al. |
| 7,211,831 B2 | 5/2007 | Erchak et al. |
| 7,335,920 B2 | 2/2008 | Denbaars et al. |
| 7,355,210 B2 | 4/2008 | Ou et al. |
| 7,473,936 B2 | 1/2009 | Tran et al. |
| 7,524,686 B2 | 4/2009 | Chu et al. |
| 7,629,195 B2 | 12/2009 | Tran et al. |
| 7,704,763 B2 | 4/2010 | Fujii et al. |
| 7,897,420 B2 | 3/2011 | Chu et al. |
| 7,932,106 B2 | 4/2011 | Li |
| 8,114,698 B2 | 2/2012 | Zhong et al. |
| 8,368,183 B2 * | 2/2013 | Yamada .............. H01L 21/0237 257/627 |
| 8,378,567 B2 * | 2/2013 | Chao ........................ H01L 33/20 257/79 |
| 9,048,378 B2 | 6/2015 | Shatalov et al. |
| 9,142,741 B2 | 9/2015 | Shatalov et al. |
| 9,324,560 B2 | 4/2016 | Shatalov et al. |
| 9,337,387 B2 | 5/2016 | Shatalov et al. |
| 9,847,450 B2 * | 12/2017 | Liao ........................ H01L 33/20 |
| 2002/0123164 A1 | 9/2002 | Slater, Jr. et al. |
| 2003/0132445 A1 | 7/2003 | Yoshitake et al. |
| 2004/0012958 A1 | 1/2004 | Hashimoto et al. |
| 2004/0016936 A1 * | 1/2004 | Tanaka ..................... H01L 33/20 257/98 |
| 2005/0205884 A1 * | 9/2005 | Kim ........................ H01L 33/18 257/98 |
| 2005/0212002 A1 * | 9/2005 | Sanga ..................... H01L 33/20 257/96 |
| 2005/0221521 A1 | 10/2005 | Lee et al. |
| 2006/0091412 A1 | 5/2006 | Wheatley et al. |
| 2006/0186424 A1 | 8/2006 | Fujimoto et al. |
| 2006/0204865 A1 | 9/2006 | Erchak et al. |
| 2006/0273335 A1 * | 12/2006 | Asahara ................ H01L 33/405 257/98 |
| 2007/0018187 A1 | 1/2007 | Lee et al. |
| 2007/0108459 A1 | 5/2007 | Lu |
| 2007/0134834 A1 | 6/2007 | Lee et al. |
| 2008/0012034 A1 | 1/2008 | Thielen et al. |
| 2008/0277686 A1 | 11/2008 | Tsai |
| 2009/0159871 A1 | 6/2009 | Lee et al. |
| 2009/0159907 A1 | 6/2009 | Wang |
| 2009/0166666 A1 | 7/2009 | Yao et al. |
| 2009/0242913 A1 | 10/2009 | Kim et al. |
| 2009/0302429 A1 | 12/2009 | Plossl et al. |
| 2009/0315055 A1 | 12/2009 | Tamboli et al. |
| 2010/0019263 A1 | 1/2010 | Yeh et al. |
| 2010/0038664 A1 | 2/2010 | Strauss |
| 2010/0136728 A1 | 6/2010 | Horng et al. |
| 2010/0283065 A1 | 11/2010 | Yen |
| 2011/0012155 A1 * | 1/2011 | Huang ................ H01L 33/0095 257/98 |
| 2011/0024783 A1 | 2/2011 | Horng et al. |
| 2011/0215290 A1 | 9/2011 | Choi et al. |
| 2012/0009768 A1 * | 1/2012 | Tadatomo ............... C30B 25/18 438/479 |
| 2012/0083063 A1 * | 4/2012 | Shinoda .............. H01L 21/0242 438/47 |
| 2012/0299014 A1 * | 11/2012 | Hikosaka ................ H01L 33/12 257/77 |
| 2013/0056770 A1 | 3/2013 | Shatalov et al. |
| 2013/0214296 A1 | 8/2013 | Mohammed et al. |
| 2014/0070165 A1 * | 3/2014 | Park .................. H01L 21/02458 257/13 |
| 2014/0131732 A1 * | 5/2014 | Fu ........................... H01L 33/12 257/76 |
| 2014/0134773 A1 * | 5/2014 | Jain ........................ H01L 33/32 438/44 |
| 2014/0175474 A1 * | 6/2014 | Han ..................... H01L 33/007 257/94 |
| 2015/0097209 A1 * | 4/2015 | Yang ...................... H01L 33/20 257/103 |
| 2015/0228855 A1 | 8/2015 | Shatalov et al. |
| 2016/0049551 A1 | 2/2016 | Shatalov et al. |
| 2016/0079061 A1 * | 3/2016 | Tanigawa .......... H01L 21/02658 257/622 |
| 2016/0149099 A1 | 5/2016 | Shatalov et al. |
| 2016/0163927 A1 * | 6/2016 | Gardner ............... H01L 33/007 257/103 |
| 2017/0104131 A1 | 4/2017 | Shatalov et al. |

FOREIGN PATENT DOCUMENTS

| | | |
|---|---|---|
| JP | 2010129596 A | 6/2010 |
| JP | 2015515119 A | 5/2015 |
| KR | 100661602 B1 | 12/2006 |
| KR | 20080006207 A | 1/2008 |
| KR | 20110053645 A | 5/2011 |
| KR | 20110111718 A | 10/2011 |
| KR | 20130071087 A | 6/2013 |
| WO | 2006096767 A1 | 9/2006 |

OTHER PUBLICATIONS

Chen, et al., "Improvement in Light Extraction Efficiency of High Brightness InGaN-Based Light Emitting Diodes," Proc. Of SPIE, 2009, 10 pages, vol. 7216.

Fujii, et al., "Increase in the extraction efficiency of GaN-based light-emitting diodes via surface roughening," Applied Physics Letters, Feb. 9, 2004, 4 pages, vol. 84, No. 6.

Ghannam, et al., "A semiquantitative model of a porous silicon layer used as a light diffuser in a thin film solar cell," Solar Energy Materials & Solar Cells 60, 2000, 21 pages.

Huh, et al., "Improved light-output and electrical performance of InGaN-based light-emitting diode by microroughening pf the p-GaN surface," Journal of Applied Physics, Jun. 1, 2003, 4 pages, vol. 93, No. 11.

Ishiguro, et al., "Solar Light Absorption Property ofSputtered Al—N Films with Enhanced Surface Roughness during Film Growth," Jpn. Journal of Applied Physics, Jan. 2002, 9 pages, vol. 41, No. 1.

Kawato, et al., "Multiple scattering of light in porous glass," Physical Review B, Jan. 1, 1994, 5 pages, vol. 49, No. 1.

Papa, et al., "Investigation of surface roughness on etched glass surfaces," Thin Solid Films, 2011, 4 pages.

Ritchie, et al., "Applications of thin graded-index films to solar absorbers," Applied Optics, May 1977, 6 pages, vol. 16, No. 5.

Striemer, et al., "Dynamic etching of silicon for broadband antireflection applications," Applied Physics Letters, Oct. 14, 2002, 3 pages, vol. 81, No. 16.

Windisch, et al., "Light-Extraction Mechanisms in High-Efficiency Surface-Textured Light-Emitting Diodes," IEEE Journal on Selected Topics in Quantum Electronics, Mar.-Apr. 2002, 8 pages, vol. 8, No. 2.

Yamada, et al., "InGaN-Based Near-Ultraviolet and Blue-Light-Emitting Diodes with High External Quantum Efficiency Using a Patterned Sapphire Substrate and a Mesh Electrode," Jpn. Journal of Applied Physics, Dec. 15, 2002, 3 pages, vol. 41.

(56) References Cited

OTHER PUBLICATIONS

Park, H., International Application No. PCT/US2017/013994, International Search Report and Written Opinion, dated May 12, 2017, 13 pages.

* cited by examiner

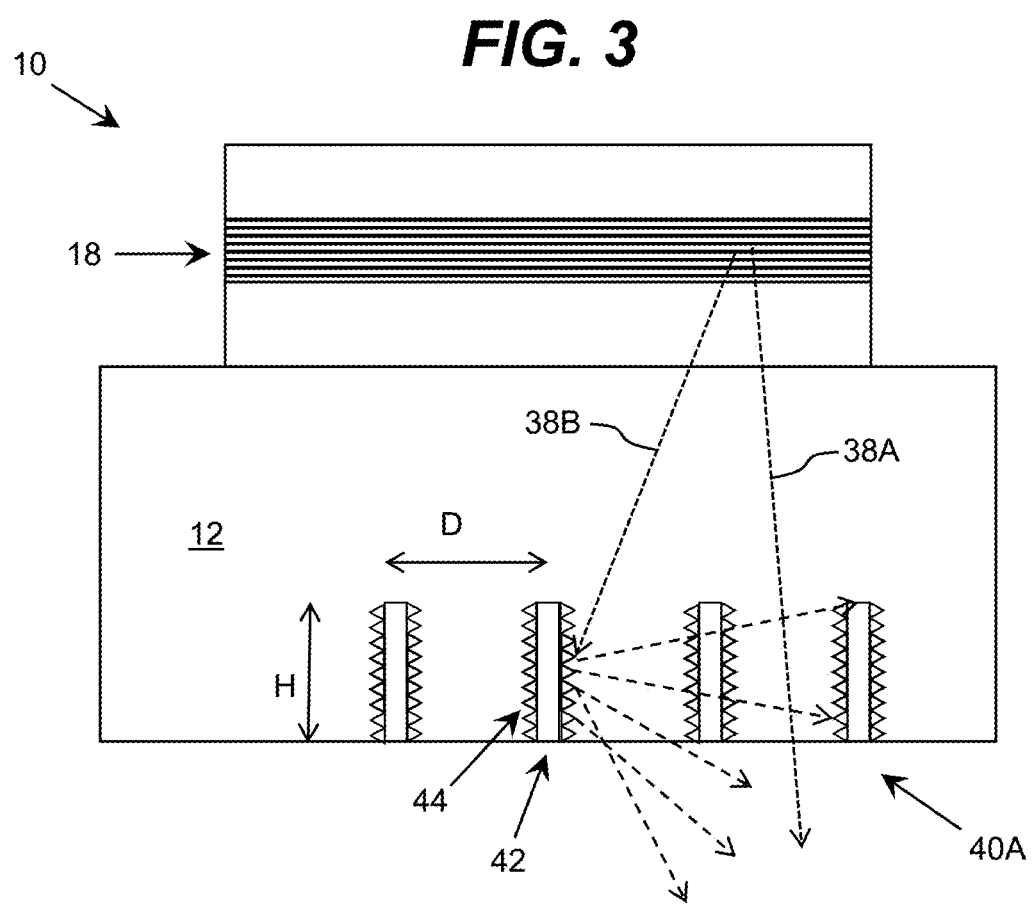

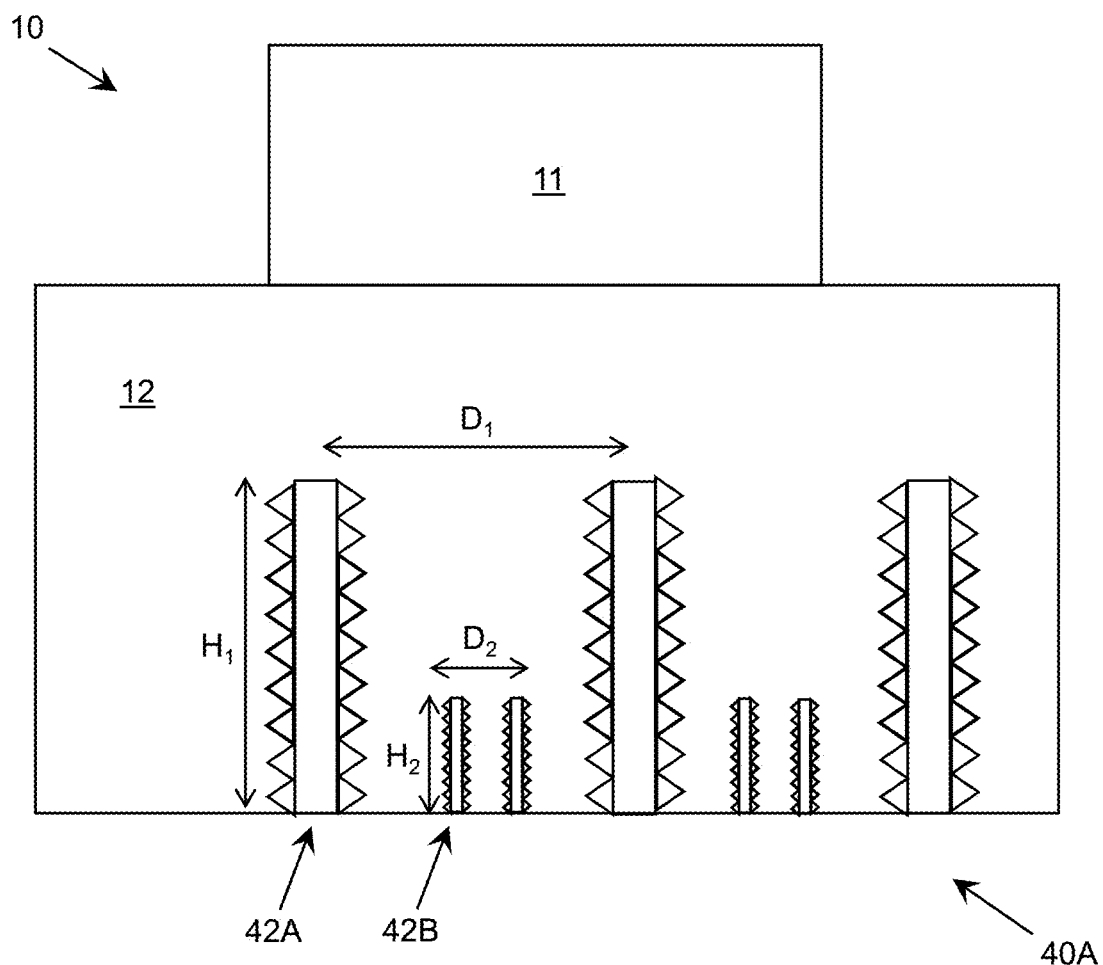

FIG. 10A
10 Groves in x and y LEE=11.3%
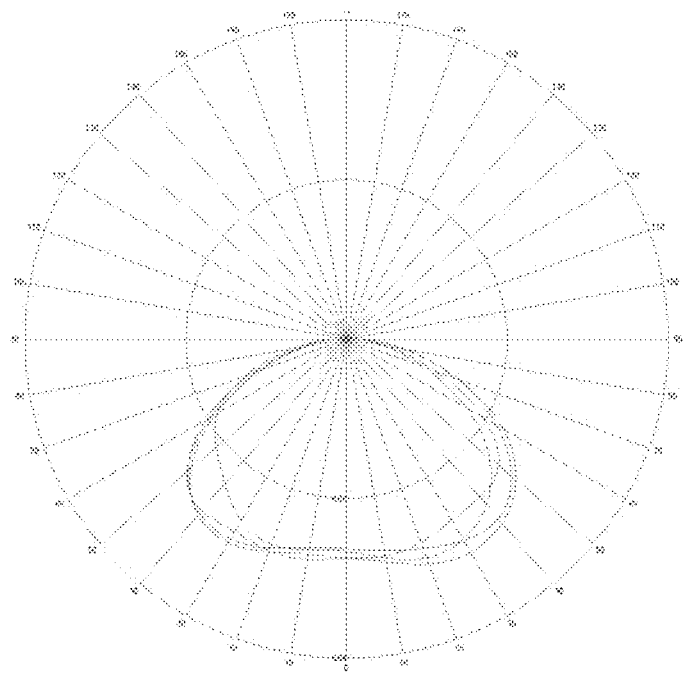
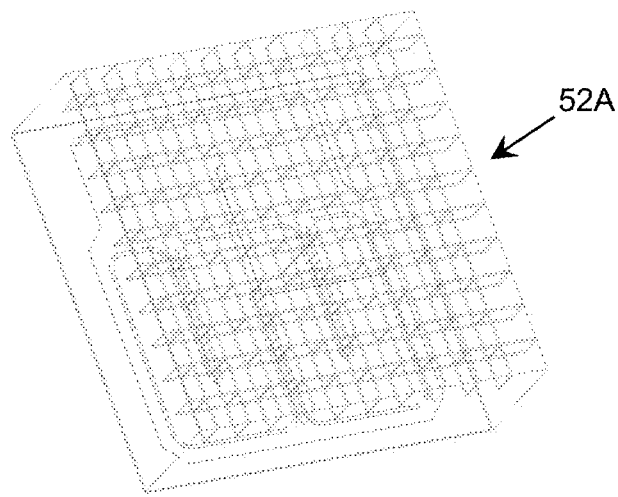

FIG. 10B
20 Groves in x and y LEE=12.%
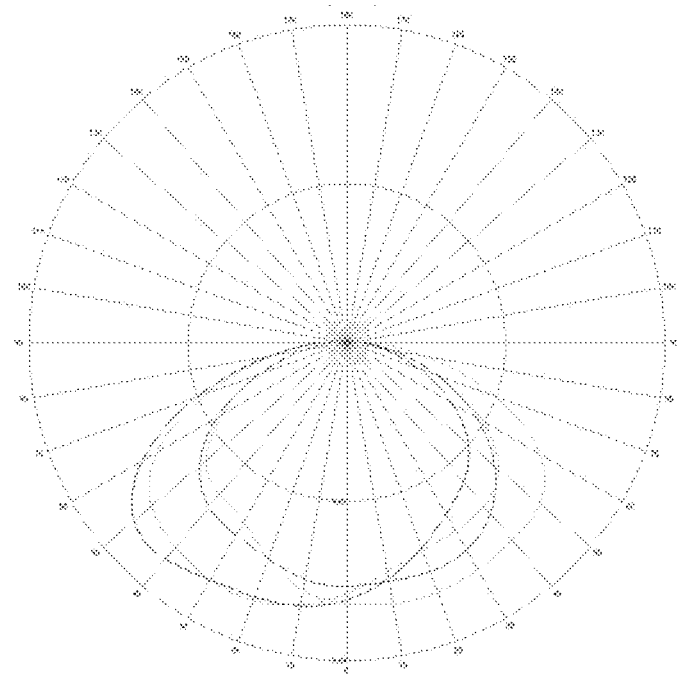
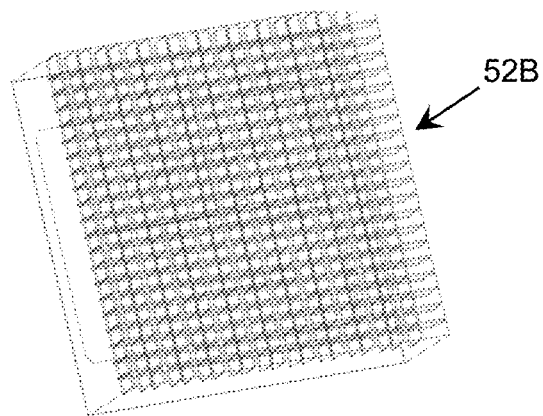

SEMICONDUCTOR DEVICE WITH IMPROVED LIGHT PROPAGATION

REFERENCE TO RELATED APPLICATIONS

The current application claims the benefit of U.S. Provisional Application No. 62/279,903, which was filed on 18 Jan. 2016, and which is hereby incorporated by reference.

TECHNICAL FIELD

The disclosure relates generally to emitting devices, and more particularly, to an emitting device with improved light extraction.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride based LEDs and LDs can be of the form $In_yAl_xGa_{1-x-y}N$, where x and y indicate the molar fraction of a given element, $0 \le x$, $y \le 1$, and $0 \le x+y \le 1$. Other illustrative group III nitride based LEDs and LDs are based on boron (B) nitride (BN) and can be of the form $Ga_zIn_yAl_xB_{1-x-y-z}N$, where $0 \le x$, y, $z \le 1$, and $0 \le x+y+z \le 1$.

An LED is typically composed of semiconducting layers. During operation of the LED, an applied bias across doped layers leads to injection of electrons and holes into an active layer where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the optical properties of the layer. In particular, the refractive index and absorption characteristics of a layer are sensitive to the molar fractions of the semiconductor alloy.

An interface between two layers is defined as a semiconductor heterojunction. At an interface, the combination of molar fractions is assumed to change by a discrete amount. A layer in which the combination of molar fractions changes continuously is said to be graded. Changes in molar fractions of semiconductor alloys can allow for band gap control, but can lead to abrupt changes in the optical properties of the materials and result in light trapping. A larger change in the index of refraction between the layers, and between the substrate and its surroundings, results in a smaller total internal reflection (TIR) angle (provided that light travels from a high refractive index material to a material with a lower refractive index). A small TIR angle results in a large fraction of light rays reflecting from the interface boundaries, thereby leading to light trapping and subsequent absorption by layers or LED metal contacts.

Roughness at an interface allows for partial alleviation of the light trapping by providing additional surfaces through which light can escape without totally internally reflecting from the interface. Nevertheless, light only can be partially transmitted through the interface, even if it does not undergo TIR, due to Fresnel losses. Fresnel losses are associated with light partially reflected at the interface for all the incident light angles. Optical properties of the materials on each side of the interface determines the magnitude of Fresnel losses, which can be a significant fraction of the transmitted light.

SUMMARY OF THE INVENTION

Aspects of the invention provide a semiconductor structure for use in fabricating a semiconductor device having improved light propagation is provided. The structure includes at least one layer transparent to radiation having a target wavelength relevant to operation of the semiconductor device. During operation of the semiconductor device, radiation of the target wavelength enters the transparent layer through a first side and exits the transparent layer through a second side. At least one of the first side or the second side comprises a profiled surface. The profiled surface includes a plurality of vacancies fabricated in the material of the layer. Each vacancy comprises side walls configured for at least partial diffusive scattering of the radiation of the target wavelength.

A first aspect of the invention provides a semiconductor structure comprising: a layer transparent to radiation having a target wavelength, wherein radiation of the target wavelength enters the transparent layer through a first side and exits the transparent layer through a second side, and wherein the second side comprises a profiled surface, the profiled surface including a plurality of vacancies fabricated in the material of the layer, wherein each vacancy comprises side walls configured for at least partial diffusive scattering of the radiation of the target wavelength.

A second aspect of the invention provides an optoelectronic device comprising: an active region configured to operate in relation to electromagnetic radiation having a target wavelength; and a transparent layer located adjacent to the active region, wherein radiation of the target wavelength enters the transparent layer through a first side and exits the transparent layer through a second side during operation of the optoelectronic device, and wherein the second side comprises a profiled surface, the profiled surface including a plurality of vacancies fabricated in the material of the transparent layer, wherein each vacancy comprises side walls configured for at least partial diffusive scattering of the radiation of the target wavelength.

A third aspect of the invention provides an emitting device comprising: a sapphire substrate; a buffer layer located on a first side of the sapphire substrate; and an active region located on the buffer layer, wherein the active region is configured to emit electromagnetic radiation having a target wavelength, wherein the radiation of the target wavelength enters the sapphire substrate through the first side and exits the sapphire substrate through a second side opposite the first side during operation of the emitting device, and wherein the second side comprises a profiled surface, the profiled surface including a plurality of vacancies fabricated in the material of the transparent layer, wherein each vacancy comprises side walls configured for at least partial diffusive scattering of the radiation of the target wavelength.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 3 shows an illustrative design of an emitting device according to an embodiment.

FIG. 5 shows another illustrative design of an emitting device according to an embodiment.

FIGS. 10A and 10B show illustrative intensity distributions as a function of angle for devices with different profiled exit surfaces according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor structure for use in fabricating a semiconductor device having improved light propagation is provided. The structure includes at least one layer transparent to radiation having a target wavelength relevant to operation of the semiconductor device. During operation of the semiconductor device, radiation of the target wavelength enters the transparent layer through a first side and exits the transparent layer through a second side. At least one of the first side or the second side comprises a profiled surface. The profiled surface includes a plurality of vacancies fabricated in the material of the layer. Each vacancy comprises side walls configured for at least partial diffusive scattering of the radiation of the target wavelength.

As used herein, unless otherwise noted, the term "set" means one or more (i.e., at least one) and the phrase "any solution" means any now known or later developed solution. It is understood that, unless otherwise specified, each value is approximate and each range of values included herein is inclusive of the end values defining the range. As used herein, unless otherwise noted, the term "approximately" is inclusive of values within +/− ten percent of the stated value, while the term "substantially" is inclusive of values within +/− five percent of the stated value. Unless otherwise stated, two values are "similar" when the smaller value is within +/− twenty-five percent of the larger value. A value, y, is on the order of a stated value, x, when the value y satisfies the formula $0.1x \leq y \leq 10x$.

As also used herein, a layer is a transparent layer (or at least partially transparent layer) when the layer allows at least five percent of radiation having a target wavelength, which is radiated at a normal incidence to an interface of the layer, to pass there through. Furthermore, as used herein, a layer is a reflective layer (or an at least partially reflective layer) when the layer reflects at least five percent of radiation having a target wavelength, which is radiated at a normal incidence to an interface of the layer. In an embodiment, the target wavelength of the radiation corresponds to a wavelength of radiation emitted or sensed (e.g., peak wavelength+/− five nanometers) by an active region of an optoelectronic device during operation of the device. For a given layer, the wavelength can be measured in a material of consideration and can depend on a refractive index of the material.

Figure 1:
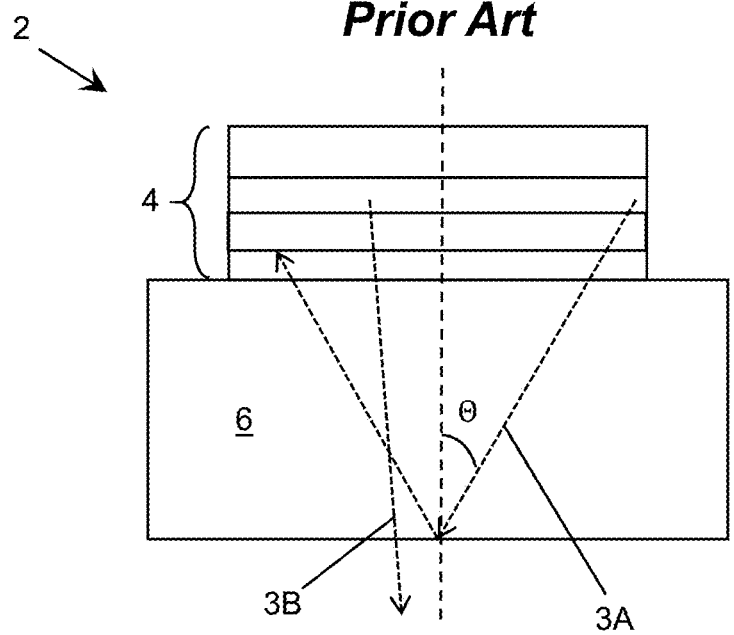
FIG. 1 shows an illustrative light emitting device according to the prior art.

Turning to the drawings, FIG. 1 shows an illustrative light emitting device 2 according to the prior art. As illustrated, the device 2 includes a device mesa 4, which is formed on a substrate 6. The substrate 6 can be transparent to light emitted from an active region of the device mesa 4. For example, the substrate 6 can be sapphire. Rays 3A, 3B emitted by the active region of the device mesa 4 can be directed such that they are directed toward the substrate 6 for transmission from the substrate 6 (e.g., a media with a high refractive index, such as sapphire, which has a refractive index n~1.8, for ultraviolet radiation of a wavelength of approximately 275 nanometers) into the ambient.

However, rays, such as the ray 3A, having an angle Θ with respect to a normal of the bottom surface of the substrate 6 that is greater than the total internal reflection (TIR) angle cannot exit the device 2 through the bottom surface of the substrate 6. As a result, these rays 3A are likely to be absorbed within the structure of the device 2. For a sapphire/air interface, the TIR angle is approximately 34° for radiation of a target wavelength of approximately 275 nanometers. To improve the extraction of the rays 3A, 3B roughness is typically utilized, as well as encapsulation and lenses. Unfortunately, typical roughness elements affect not only the rays 3A that have inclination angle Θ formed to the substrate exit surface normal larger than the TIR angle, referred to as TIR rays, but also the rays 3B that propagate largely normal to the substrate exit surface, referred to as escape rays.

Figure 2:
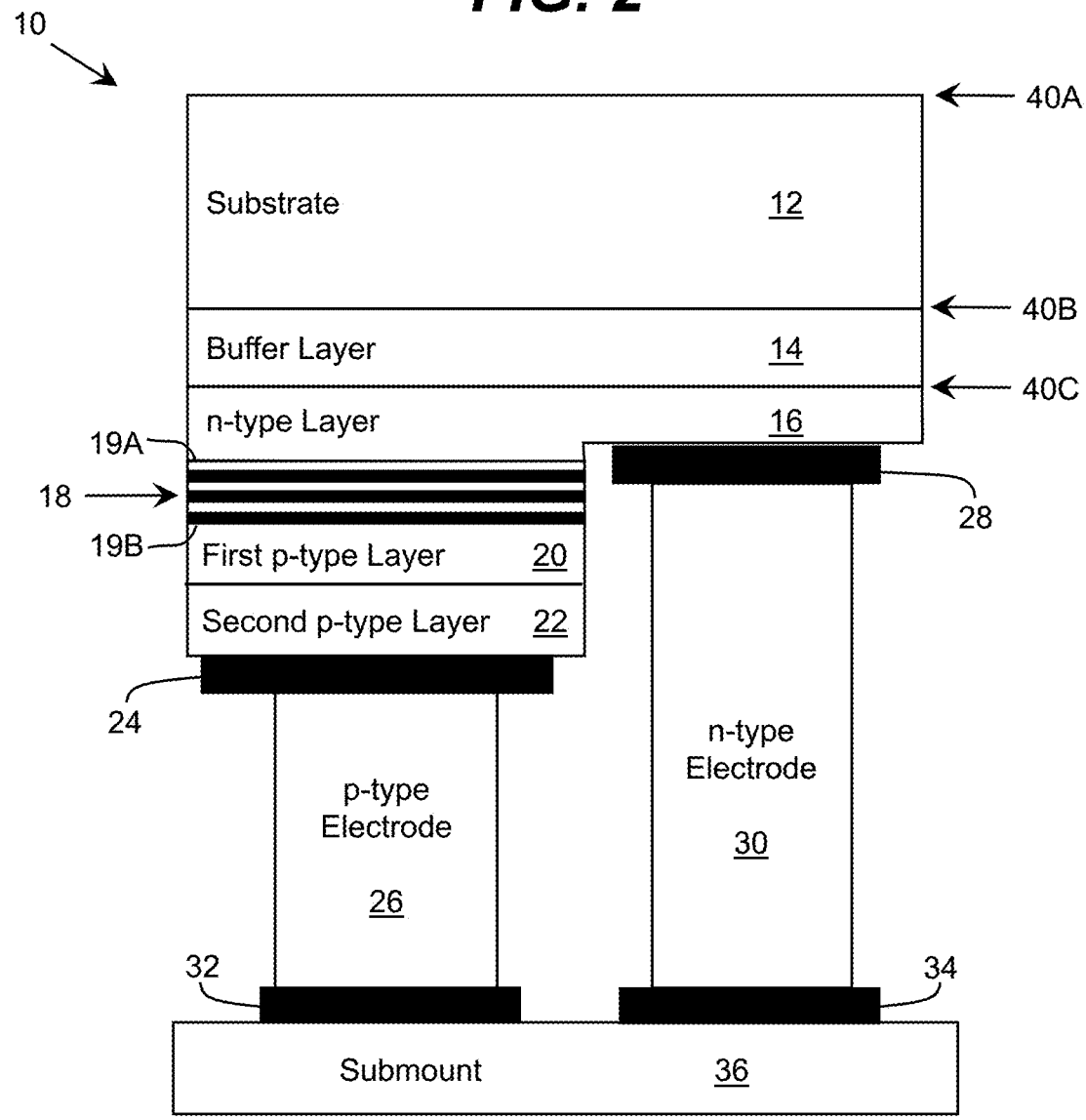
FIG. 2 shows a schematic structure of an illustrative emitting device according to an embodiment.

FIG. 2 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type cladding layer 16 and the p-type layer 20 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, and 20. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18. For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the electron supply layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg+Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Regardless, the device 10 can include one or more at least partially reflective layers on a first side of the active region 18 and one or more layers having a profiled surface 40A-40C on an opposing side of the active region 18 through which radiation generated in the active region 18 can leave the device 10. As illustrated, each profiled surface 40A-40C is configured to provide a boundary for an interface between two adjacent layers and/or an interface between the device 10 and the surrounding environment that is uneven or rough rather than substantially smooth. In an embodiment, the device 10 can include a profiled surface 40A-40C at each interface where the refractive index changes abruptly (e.g., a difference in refractive indexes greater than or equal to approximately five percent). Illustrative configurations of devices including one or more profiled surfaces are shown and described in U.S. patent application Ser. No. 14/728,435, filed on 2 Jun. 2015, which is hereby incorporated by reference.

As described herein, the substrate 12 can be made of sapphire, the buffer layer 14 can be AlN, and the cladding layer 14 can be AlGaN. For radiation of an illustrative target wavelength, such as ultraviolet radiation of a wavelength of approximately 275 nanometers, these materials can have indexes of refraction of 1.8, 2.3, and 2.5, respectively. To this extent, the device 10 is shown including a profiled surface 40A at the interface between the substrate 12 and the environment (which has an index of refraction of approximately one); a profiled surface 40B at the interface between the buffer layer 14 and the substrate 12; and/or a profiled surface 40C at the interface between the n-type cladding layer 16 and the buffer layer 14. In this case, the buffer layer 14 can act as a light extraction film inserted between two materials with two different refraction indexes to provide a more gradual transition of refraction indexes.

FIG. 3 shows an illustrative design of an emitting device 10 according to an embodiment. As illustrated, the device 10 can include heterostructure described herein, which includes an active region 18 configured to generate radiation 38A, 38B that is directed to exit the device 10 primarily through a bottom surface of the substrate 12. The substrate 12 can include a profiled bottom surface 40A, which is configured to improve propagation of the radiation through an interface between the bottom surface of the substrate 12 and, for example, ambient.

To this extent, the bottom surface can include a set of roughness elements 42. A roughness element 42 can be configured to mostly affect TIR rays, such as the ray 38B, without substantially affecting escape rays, such as the ray 38A. For example, the roughness element 42 can present a large cross-section area to TIR rays 38B and a small cross-section area to escape rays 38A. In an embodiment, the roughness element 42 forms a vacancy within the material of the substrate 12. In a more particular embodiment, the vacancy is a groove. The groove can have a shape of an approximately rectangular cuboid. In an alternative embodiment, the vacancy is a deep localized vacancy, with the length and width of the vacancy being smaller than the depth.

To improve an effectiveness of the roughness element 42, the side walls 44 can be configured to be scattering of rays 38B which impact the side walls 44. In an embodiment, the surface of the side walls 44 are capable of at least partial diffusive scattering (i.e., the scattered radiation is less than 50% different from Lambertian scattering). In this case, the rays 38B can diffusively scatter in various directions, which can improve an extraction intensity of TIR rays 38B. Regardless, it is understood that some portion of the scattered rays is likely to still be absorbed within the device 10.

In an embodiment, a distance D between adjacent scattering elements 42 (e.g., measured as an average distance from center to center between adjacent scattering elements 42), and a size H of the scattering elements 42 (e.g., measured as an average depth of the scattering elements 42 from a bottom surface of the substrate 12) can be selected to optimize extraction efficiency of the device 10. In an illustrative embodiment, the size H is approximately ten of microns or more, while the distance D is selected based on the size H to ensure a minimum desired percentage of TIR rays are scattered. It is understood that the scattering elements 42 and/or the side walls 44 thereof can be formed using etching (e.g., wet etching) of the substrate 12 exit surface (e.g., bottom surface) with an appropriate surface treatment of the roughness.

Figure 4A:
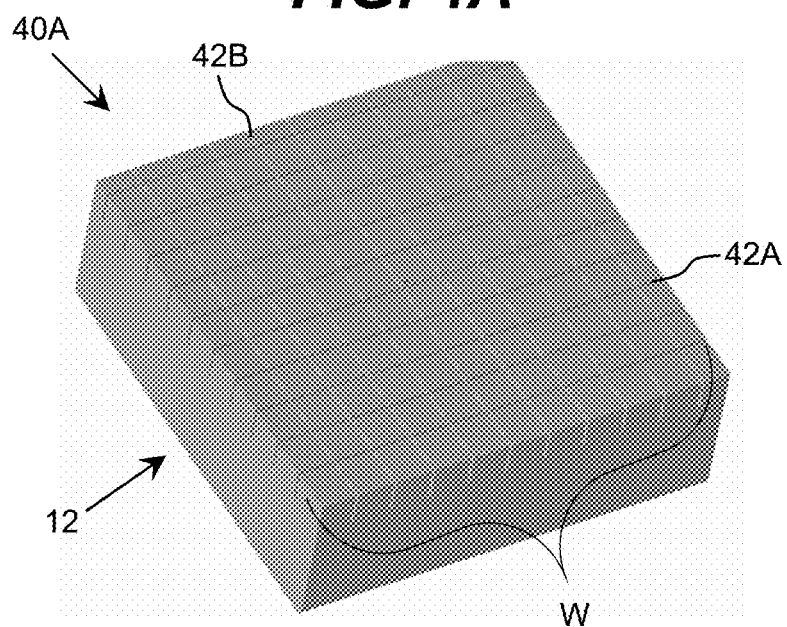
FIGS. 4A and 4B show perspective and close up views, respectively, of an illustrative substrate having a profiled surface according to an embodiment.
Figure 4B:
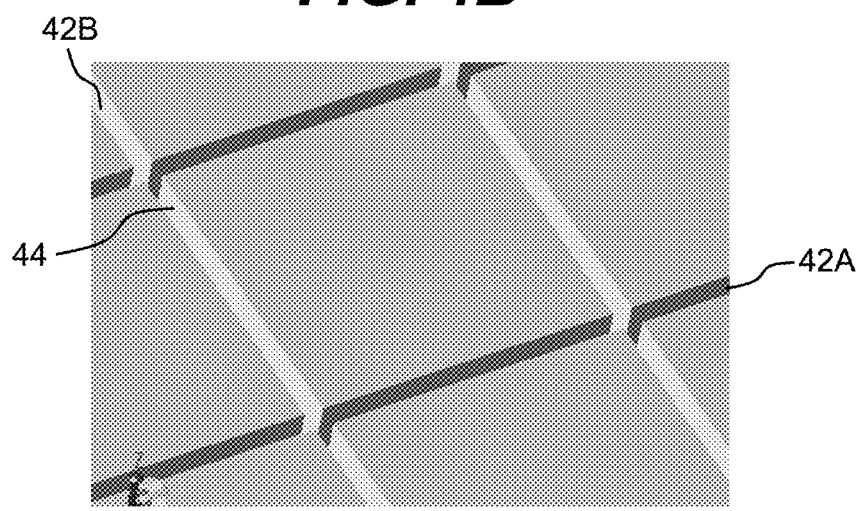

FIGS. 4A and 4B show perspective and close up views, respectively, of an illustrative substrate 12 having a profiled surface 40A according to an embodiment. As illustrated, the profiled surface 40A can include a plurality of roughness elements 42A, 42B, which comprise elongated grooves extending throughout an exit surface (e.g., the bottom surface) of the substrate 12. As illustrated, the elongated grooves can form a rectangular mesh. In particular, the roughness elements 42A, 42B can have a periodic pattern in which a first subset of the roughness elements 42A comprises substantially parallel, evenly spaced elongated grooves extending in a first direction, while the second subset of the roughness elements 42B comprises substantially parallel, evenly spaced elongated grooves extending in a second direction. The subsets of the roughness elements 42A, 42B can intersect with one another. In an embodiment, the subsets of the roughness elements 42A, 42B can be substantially orthogonal to each other. However, it is understood that the profiled surface 40A is only illustrative of various possible configurations of profiled surfaces 40A. To this extent, embodiments of a profiled surface described herein can include one or more of: roughness elements with irregular and/or varying spacing; non-orthogonal intersecting subsets of roughness elements; and/or the like. Similarly, it is understood that a roughness element described herein can be any type of opening in the surface of the substrate.

Furthermore, embodiments of a profiled surface described herein can include roughness elements of multiple scales. For example, FIG. 5 shows another illustrative design of an emitting device 10 according to an embodiment. In this case, the device 10 includes a heterostructure 11, which can include semiconductor layers with an active region as described herein, located on a substrate 12 (e.g., sapphire). The substrate 12 include a profiled exit surface 40A with subsets of roughness elements 42A, 42B of different scales. In particular, a first subset of roughness elements 42A can have a distance $D_1$ of a first distance scale, and a size $H_1$ of a first size scale, while a second subset of roughness elements 42B can have a distance $D_2$ of a second distance scale, and a size $H_2$ of a second size scale. In an embodiment, the first subset of roughness elements 42A can provide a first variation of the profiled surface 40A having a characteristic scale approximately an order of magnitude larger than a target wavelength of the radiation passing there through, while the second subset of roughness elements 42B can provide a second variation of the profiled surface having a characteristic scale on the order of the target wavelength of the radiation.

Figure 6:
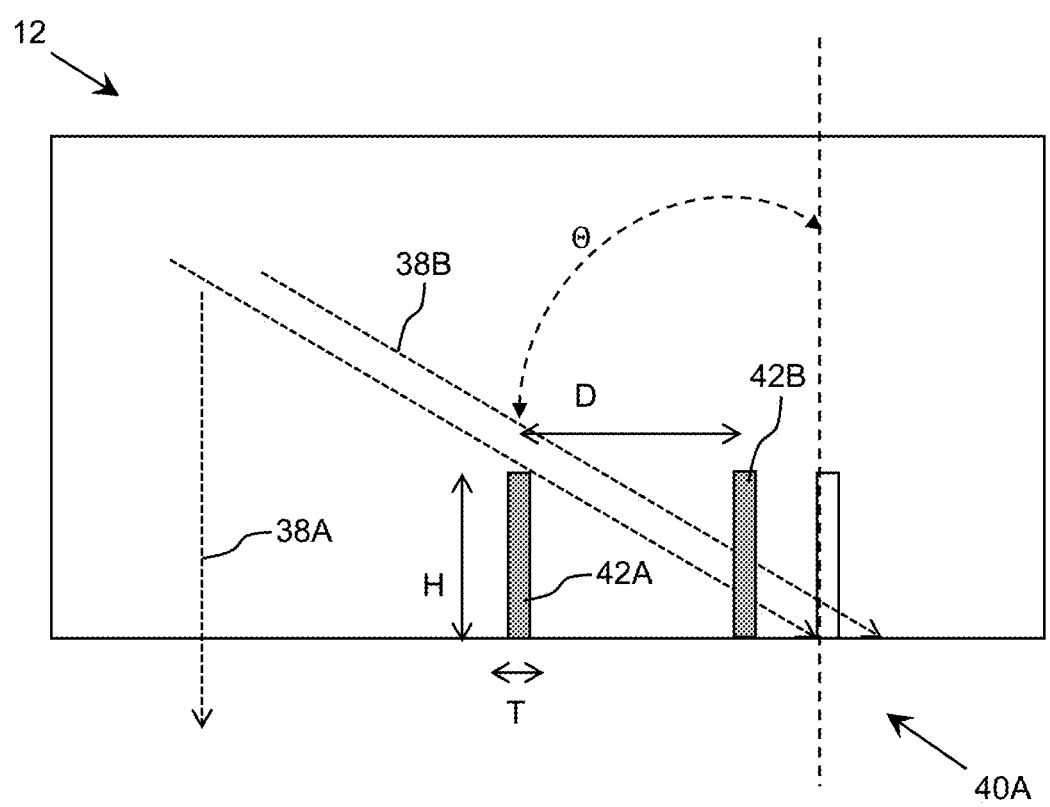
FIG. 6 shows an illustrative procedure for optimizing the size and distance for roughness elements according to an embodiment.

As discussed herein, the roughness elements 42A, 42B can be optimized to improve light extraction from the substrate 12. FIG. 6 shows an illustrative procedure for optimizing the size H and distance D for roughness elements 42A, 42B according to an embodiment. Considering an incident TIR ray 38B propagating with an incident angle $\Theta \geq$ the TIR angle, to ensure ray scattering, a ray 38B that clears (i.e., is not scattered by) a first roughness element 42A must be scattered by another roughness element 42B prior to reaching the exit surface of the substrate 12. To ensure that this occurs, the separation distance D between the roughness elements 42A, 42B must satisfy: $D<H/\tan(90-\Theta)=H\cdot\tan\Theta$. For an illustrative minimum TIR angle of 34°, the distance $D<0.67H$. For an illustrative size H of 10 microns, $D<6.7$ microns. Such a design rule can be derived for various minimum TIR angles and sizes to engineer an optimal profiled surface 40A.

When a roughness groove has a surface area A having a dimension $A=W \times H$, where W is the width or extent of the roughness groove as shown in FIG. 4A, a cross-sectional area to a light ray 38B propagating with an angular direction $\Theta$ with respect to the exit surface normal towards the profiled surface 40A can be calculated as $A \times \sin\Theta$. As can be seen, normal rays 38A can be expected to experience little or no scattering due to the profiled surface 40A. For a total exit surface area of the substrate 12, $A_T$, a cross-sectional area of the exit surface to a light ray of $A_T \cos\Theta$, and a substrate 12 with N roughness elements 42A, each with an area A, the probability of being scattered by the roughness elements 42A is given by $P(\Theta)=A \times N \times \sin\Theta/(A_T \cos\Theta)$ or 1, whichever is smaller, for a ray forming an angle $\Theta$ with the surface normal. To require complete scattering of all of the TIR rays, $A \times N \times \tan\Theta/A_T \leq 1$, which can be simplified to $D \leq H \cdot \tan\Theta$, similar to the previous equation. To this extent, the size H of the roughness elements 42A, 42B is equal to or larger than the characteristic distance D between the roughness elements 42A, 42B divided by the tangent of the total internal reflection angle $\Theta$. In an embodiment, the size H is comparable to the distance D, and both values are on the order of 1-100 microns.

In an embodiment, a thickness T of each roughness element 42A, 42B is kept relatively thin to minimize the scattering of escape rays 38A. In a more particular embodiment, the thickness T can be a fraction of the distance D. In a still more particular embodiment, the thickness T is approximately 1/10 of the distance D. For technological reasons, a reasonable minimal thickness T is approximately 1 micron. For such an embodiment and using the equations derived above, the distance D can be approximately 10 microns, and the size H can be about 15 microns.

Figure 7A:
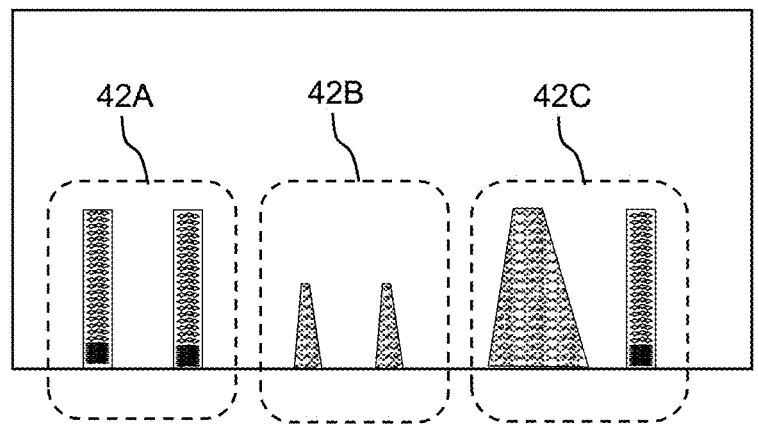
FIGS. 7A and 7B show various illustrative configurations of roughness elements according to embodiments.
Figure 7B:
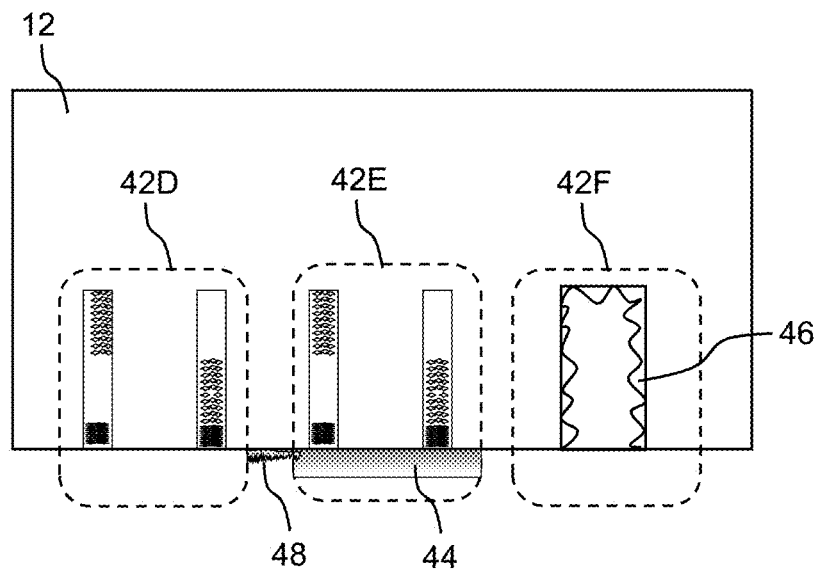

The roughness components can include any of various combinations of features, which can improve the diffusive scattering of TIR rays and/or the like. FIGS. 7A and 7B show various illustrative configurations of roughness elements according to embodiments. For example, in FIG. 7A, roughness elements 42A can be at least partially filled with a diffusive scattering material, thereby allowing for efficient diffusive reflectivity of radiation from the surfaces of such roughness elements 42A. In an illustrative embodiment, the diffusive scattering material is reflective. Illustrative diffusive reflective materials include aluminum, fluoropolymers (e.g., polytetrafluoroethylene (PTFE)), and/or the like. In an embodiment, the diffusive scattering material is amorphous $Al_2O_3$. As illustrated by the roughness elements 42B, roughness elements described herein can have a non-rectangular cross-section. Illustrative cross-sectional shapes include a pyramid, truncated pyramid, trench, conical shape, and/or the like. As shown by roughness elements 42C, a combination of roughness elements of different shapes and/or sizes can be utilized.

In FIG. 7B, a group of roughness elements 42C are illustrated, which are only partially filled with multiple types of materials. As shown, the various roughness elements 42D can include combinations of two or more of the materials that are configured differently. For example, an order of the materials, locations of the materials, and/or a particular combination of materials, can vary between roughness elements 42D. The differing materials can be selected, for example, based on differing optical properties. Illustrative materials comprise $SiO_2$, $Al_2O_3$, $CaF_2$, $MgF_2$, fluoropolymers, and/or the like. As illustrated by the roughness elements 42E, an exit surface of the substrate 12 can include a film 44 deposited thereon. For example, the film 44 can comprise a coating of an antireflective material such as $SiO_2$, $CaF_2$, $MgF_2$, and/or the like. As shown by the roughness element 44F, an internal surface of the roughness element can be configured to improve scattering. For example, the internal surface can be coated with a diffusive material 46, which can cause either transparent or reflective diffusive scattering. For example, such materials can comprise a fluoropolymer such as Teflon® and/or the like. Furthermore, the internal surface of the roughness element 44F (with or without the diffusive material 46) can be patterned to promote scattering. In an embodiment, at least a portion of the external surface of the substrate can contain additional roughness features 48, which can further improve light extraction from the substrate 12.

In an embodiment, a shape of a roughness element described herein is selected based on one or more fabrication processes. For example, the shape of a roughness element can be selected to ensure that an etching solution will adequately reach all of the surfaces of the roughness element (e.g., a groove) to yield uniform diffusive scattering from all of the surfaces of the roughness element.

Figure 8A:
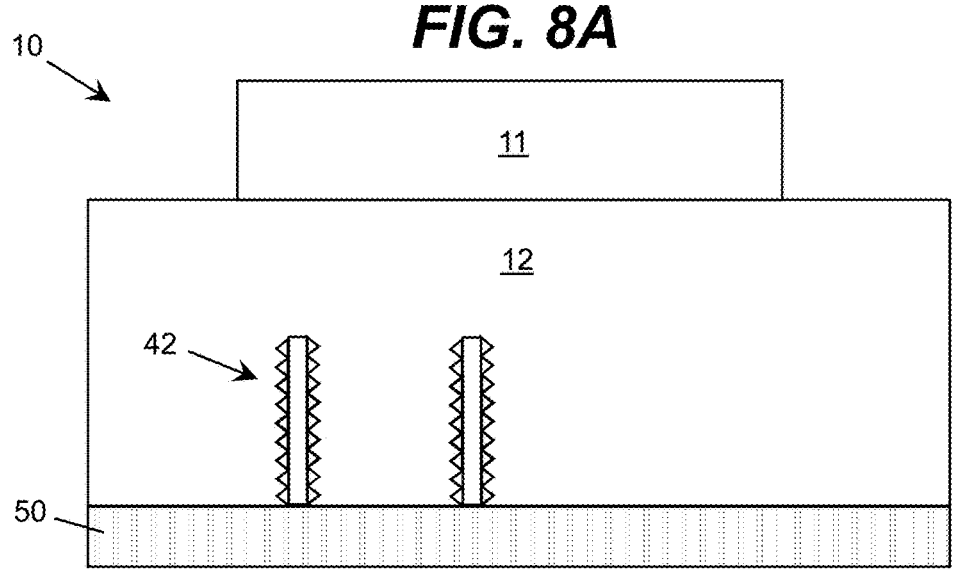
FIGS. 8A-8C show illustrative devices with additional features according to embodiments.

It is understood that a profiled surface described herein can be implemented in conjunction with various additional features. For example, FIG. 8A shows an illustrative device 10 including a heterostructure 11 located on a substrate 12 with a set of roughness elements 42. In this embodiment, an exit surface of the substrate 12 is shown having a porous layer 50 located thereon. The porous layer 50 can have a morphology, which results in variation of an index of refraction throughout the porous layer 50, thereby providing a graded refractive index layer. In an illustrative embodiment, the porous layer 50 can comprise an anodized aluminum oxide (AAO) layer. Other examples of a porous layer 50 include sputtering of light transparent nanostructures such as $Al_2O_3$ nanorods over the exit surface of the substrate 12. In an embodiment, such nanostructures can comprise nanowires, pillars and/or pyramid based shapes, and can be deposited to form an angle with the exit surface.

Figure 8B:
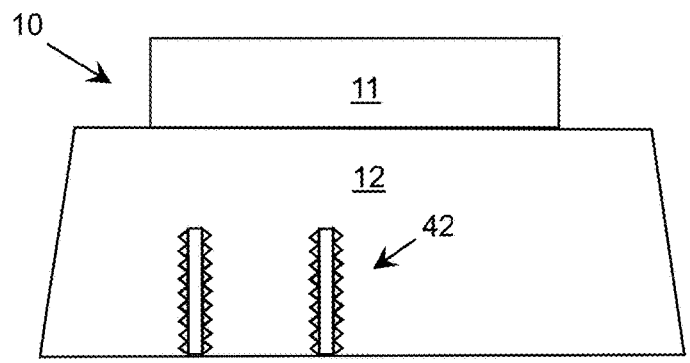
Figure 8C:
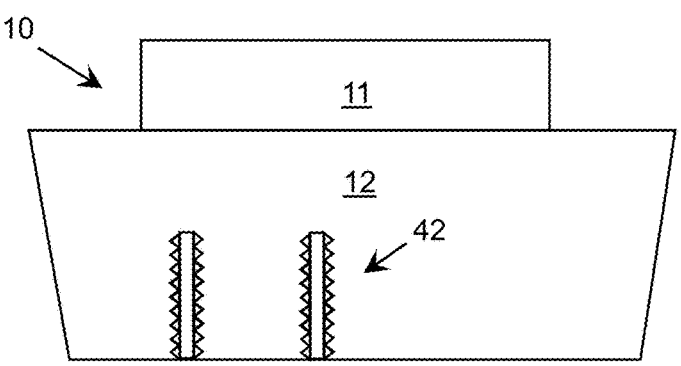

An embodiment of a device described herein can include a substrate 12 that is shaped to affect the propagation of light there through. To this extent, FIGS. 8B and 8C show illustrative devices 10 with substrates 12 being a truncated expanding prism and a truncated contracted prism, respectively. While the substrates are shown having side surfaces that are continually expanding or contracting, it is understood that this is only illustrative, and an embodiment of a substrate can include side surfaces that are parallel for at least a portion of the height of the substrate. It is understood that the angled side surfaces can have any combination of one or more angles, which can be selected to improve the extraction of light from the device. Additional discussion of various configurations for the substrate is included in U.S. patent application Ser. No. 14/984,246, filed on 30 Dec. 2015, which is hereby incorporated by reference.

Figure 9:
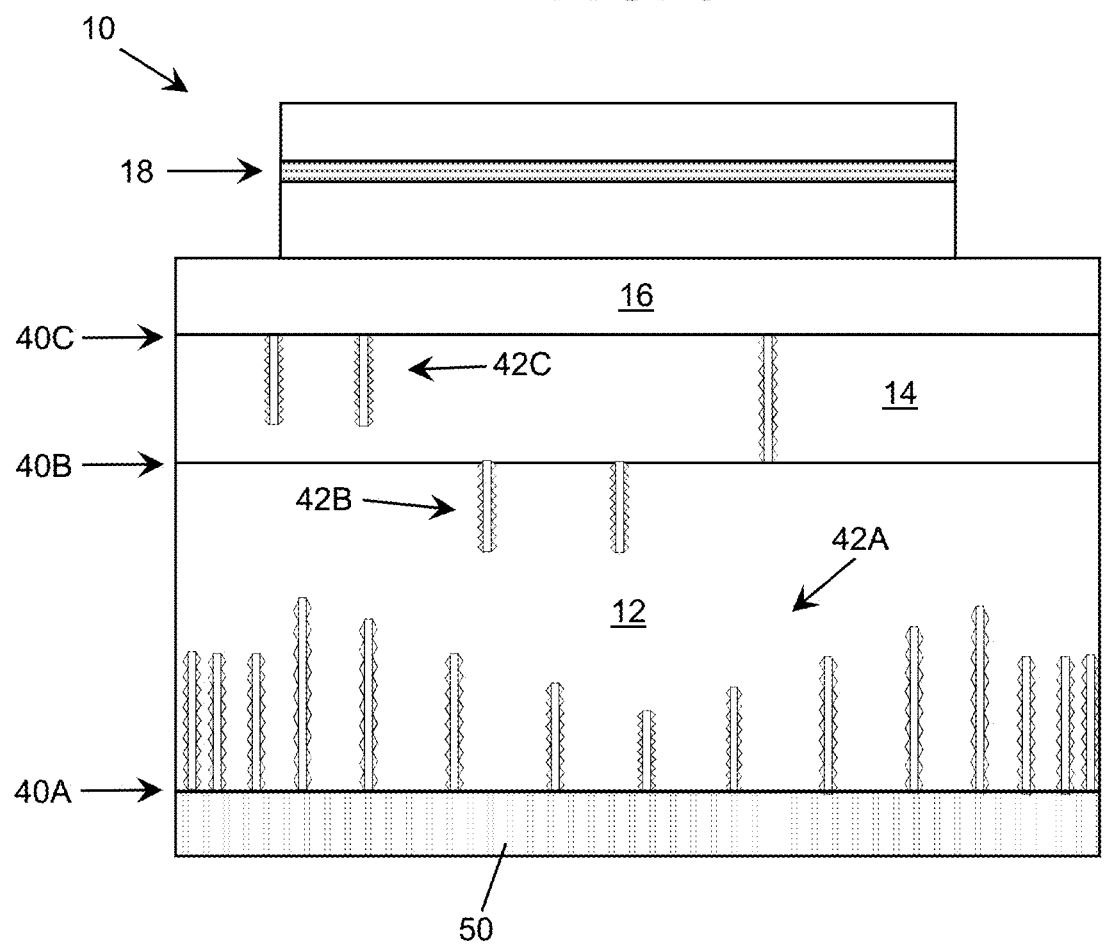
FIG. 9 shows an illustrative device including multiple profiled surfaces according to an embodiment.

As described herein, a device can include profiled surfaces in various locations throughout the heterostructure. In an embodiment, one or more of the internally located profiled surfaces includes a set of roughness elements configured as described herein. To this extent, FIG. 9 shows an illustrative device 10 including multiple profiled surfaces 40A-40C according to an embodiment. In this case, the substrate 40A is shown including a first profiled surface 40A including various roughness elements 42, which can be configured as described herein.

Additionally, a growth surface of the substrate is shown including a profiled surface 40B, which can include various roughness elements 42B. In an embodiment, the roughness elements 42B can be formed prior to deposition of a buffer layer 14 on the growth surface of the substrate 12. Furthermore, the buffer layer 14 is shown having a profiled surface 40C at an interface with an n-type layer 16 grown thereon. The profiled surface 40C can include roughness elements 42C, which can be formed prior to growth of the n-type layer 16 on the buffer layer 14.

The internally located roughness elements 42B, 42C can be configured to further promote light extraction within the device 10. To this extent, the roughness elements 42B, 42C can be configured as described herein in conjunction with the roughness elements 42A located on the exit surface of the substrate 12. Additionally, one or more attributes of the roughness elements 42B, 42C can be configured and/or adjusted to promote epitaxial growth of the corresponding semiconductor layer 14, 16. For instance, the roughness elements 42B, 42C can comprise a patterning with the corresponding semiconductor layer 14, 16 grown thereon. As is known, epitaxial growth over patterned surfaces can promote dislocation annihilation and improved morphology of epitaxial layers. The roughness elements 42A-42C can be fabricated using any solution. For example, the roughness elements 42A, 42B can be formed using a cutting device, such as a diamond saw, while the roughness elements 42C can be formed by etching the buffer layer 14 after growth thereof, but prior to growth of the n-type layer 16. As shown, one or more of the roughness elements located within the buffer layer 14 can extend through an entirety of the buffer layer 14 to a surface of the substrate 12.

It is understood that various features of the roughness elements 42A-42C in each profiled surface 40A-40C can include one or more attributes configured to affect the propagation of radiation through the corresponding interface. For example, as illustrated by the roughness elements 42A, a distribution of the roughness elements can vary laterally along the corresponding surface, such as the exit surface of the substrate 12. In an embodiment, the roughness elements 42A can form densely packed regions close to the sides of the device 10, and less densely packed regions towards the center of the device 10. This arrangement can allow for angular control of the emission from the device 10 as well as improvement in light extraction efficiency.

FIGS. 10A and 10B show illustrative intensity distributions as a function of angle for devices with different profiled exit surfaces 52A, 52B, respectively, according to embodiments. Initially, a device without a profiled exit surface was evaluated. The device exhibited at light extraction efficiency (LEE) of approximately 8.6%. As shown in FIG. 10A, for an identical embodiment of the device including a profiled exit surface 52A including 10 grooves in the x and y lateral directions (e.g., as shown in FIGS. 4A and 4B), the LEE efficiency improved to 11.3%. As shown in FIG. 10B for an identical embodiment of the device including a profiled exit surface 52B including 20 grooves in the x and y lateral directions (e.g., as shown in FIGS. 4A and 4B), the LEE efficiency improved to 12%.

While various features of the invention have been shown and described only in a subset of the figures included herein for clarity, it is understood that embodiments of devices described herein can include any combination of the features shown only in a subset of the drawings. To this extent, the drawings are not intended to show mutually exclusive embodiments of device and/or substrate configurations described herein.

Additionally, while the invention has been described in conjunction with improving light emission from an emitting device, such as a light emitting diode, it is understood that embodiments of the invention can be implemented in conjunction with any type of optoelectronic device. To this extent, such an optoelectronic device can be configured to operate as an emitting device, such as a light emitting diode (LED), a laser diode (LD), and/or the like. Alternatively, the optoelectronic device can operate as a sensing device, such as a photodiode. In this case, operation of the optoelectronic device is affected by electromagnetic radiation impinging the active region.

The electromagnetic radiation emitted (or sensed) by the optoelectronic device can have a peak wavelength within any range of wavelengths, including visible light, ultraviolet radiation, deep ultraviolet radiation, infrared light, and/or the like. In an embodiment, the device is configured to emit (or sense) radiation having a dominant wavelength within the ultraviolet range of wavelengths. In a more specific embodiment, the dominant wavelength is within a range of wavelengths between approximately 210 and approximately 360 nanometers.

As discussed herein, a device described herein can be fabricated using any solution. In one illustrative fabrication process, a material for a substrate to be used for MOCVD growth is selected, which is transparent to radiation that will be generated or sensed by the resulting optoelectronic device. Grooves can be formed on one or both sides of the substrate. The fabrication of grooves can be accomplished through the use of, for example, a cutting tool. Alternatively, the grooves can be fabricated by first applying an anodized aluminum oxide (AAO) mask, and etching the substrate. Fabrication of grooves on a side of the substrate can include multiple fabrication steps, each of which results in the formation of grooves having different sizes. Prior to application of the grooves, an anti-reflective coating can be applied on one or both sides of the substrate. For example, the anti-reflective coating can comprise a set of $SiO_2$, $Al_2O_2$, $Hf_2O_3$ films with their respective thicknesses chosen to provide antireflective properties.

Regardless, after the grooves are formed, the sides of the grooves can be etched to result in diffusive scattering. Additionally, one or more of the surfaces of the substrate (including a surface with the grooves, but not the surfaces of the grooves themselves) can be polished. Subsequently, the semiconductor heterostructure for the device can be grown on the substrate using any solution. Additionally, fabrication of the device can include application of a layer on one or more external surfaces of the substrate, e.g., to improve light propagation there through. For example, a fluoropolymer encapsulant can be applied to one or more of the external surface(s) of the substrate.

While illustrative aspects of the invention have been shown and described herein primarily in conjunction with a heterostructure for an optoelectronic device and a method of fabricating such a heterostructure and/or device, it is understood that aspects of the invention further provide various alternative embodiments.

Figure 11:
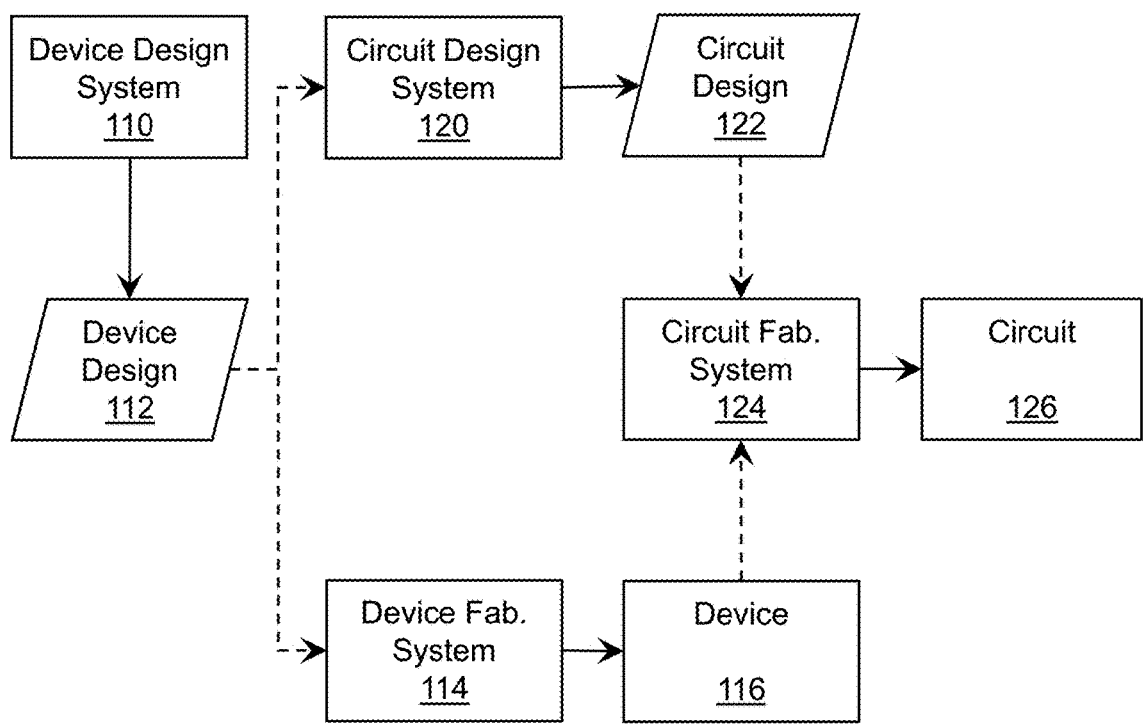
FIG. 11 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 11 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor structure comprising:
a layer transparent to radiation having a target wavelength, wherein radiation of the target wavelength enters the transparent layer through a first side and exits the transparent layer through a second side, and wherein the second side comprises a profiled surface, the profiled surface including a plurality of vacancies fabricated in the material of the layer, wherein each vacancy comprises side walls configured for at least partial diffusive scattering of the radiation of the target wavelength, wherein an average thickness of each of the plurality of vacancies is approximately one tenth of an average distance between adjacent vacancies in the plurality of vacancies.

2. The structure of claim 1, further comprising a set of semiconductor layers grown on the first side of the layer, wherein the set of semiconductor layers includes a light generating structure configured to emit radiation having the target wavelength.

3. The structure of claim 2, wherein the layer comprises a sapphire substrate.

4. The structure of claim 2, wherein the first side of the layer comprises a second profiled surface, the second profiled surface including a second plurality of vacancies fabricated in the material of the layer.

5. An optoelectronic device comprising:
an active region configured to operate in relation to electromagnetic radiation having a target wavelength; and
a transparent layer located adjacent to the active region, wherein radiation of the target wavelength enters the transparent layer through a first side and exits the transparent layer through a second side during operation of the optoelectronic device, and wherein the second side comprises a profiled surface, the profiled surface including a plurality of vacancies fabricated in the material of the transparent layer, wherein each vacancy comprises side walls configured for at least partial diffusive scattering of the radiation of the target wavelength, wherein an average thickness of each of the plurality of vacancies is approximately one tenth of an average distance between adjacent vacancies in the plurality of vacancies.

6. The device of claim 5, wherein each vacancy comprises a groove, wherein the thickness is at most approximately one tenth of a depth of the groove.

7. The device of claim 6, wherein a characteristic distance between adjacent grooves is such that a ray forming an angle with the normal of the second side that is at least an angle of total internal reflection impacts at least one of the plurality of grooves prior to the second side.

8. The device of claim 5, wherein the transparent layer comprises a sapphire substrate.

9. The device of claim 8, wherein the sapphire substrate is a truncated prism.

10. The device of claim 5, further comprising:
a buffer layer located directly on the first side of the transparent layer; and
a n-type layer located directly on the buffer layer, wherein the active region is located on the n-type layer, wherein the active region is configured to emit the electromagnetic radiation having the target wavelength.

11. The device of claim 10, wherein the first side of the transparent layer comprises a second profiled surface, the second profiled surface including a second plurality of vacancies fabricated in the transparent layer.

12. The device of claim 10, wherein a side of the buffer layer immediately adjacent to the n-type layer includes a second profiled surface, the second profiled surface including a second plurality of vacancies fabricated in the material of the buffer layer.

13. An emitting device comprising:
a sapphire substrate;
a buffer layer located on a first side of the sapphire substrate; and
an active region located on the buffer layer, wherein the active region is configured to emit electromagnetic radiation having a target wavelength, wherein the radiation of the target wavelength enters the sapphire substrate through the first side and exits the sapphire substrate through a second side opposite the first side during operation of the emitting device, and wherein the second side comprises a profiled surface, the profiled surface including a plurality of vacancies fabricated in the sapphire substrate, wherein each vacancy comprises side walls configured for at least partial diffusive scattering of the radiation of the target wavelength, wherein an average thickness of each of the plurality of vacancies is approximately one tenth of an average distance between adjacent vacancies in the plurality of vacancies.

14. The device of claim 13, wherein the first side of the sapphire substrate comprises a second profiled surface, the second profiled surface including a second plurality of vacancies fabricated in the sapphire substrate.

15. The device of claim 5, wherein each vacancy comprises a groove, wherein the groove has a depth larger than the thickness of the groove.

16. The device of claim 15, wherein a characteristic distance between adjacent grooves is such that a ray forming an angle with the normal of the second side that is at least an angle of total internal reflection impacts at least one of the plurality of grooves prior to the second side.

17. The device of claim 15, wherein the thickness is at most one tenth the depth of the groove.

18. The device of claim 15, wherein the plurality of grooves form a rectangular mesh.

19. The device of claim 5, wherein each of the plurality of vacancies has a length and a width smaller than a depth.

20. The device of claim 5, wherein each of the plurality of vacancies is at least partially filled with a diffusive scattering material.

* * * * *